(12) United States Patent
Shapira et al.

(10) Patent No.: US 8,837,550 B2
(45) Date of Patent: Sep. 16, 2014

(54) CONTINUOUS-WAVE ORGANIC DYE LASERS AND METHODS

(71) Applicants: Ofer Shapira, Cambridge, MA (US); Song-Liang Chua, Singapore (SG); Bo Zhen, Cambridge, MA (US); Jeongwon Lee, Boston, MA (US); Marin Soljacic, Belmont, MA (US)

(72) Inventors: Ofer Shapira, Cambridge, MA (US); Song-Liang Chua, Singapore (SG); Bo Zhen, Cambridge, MA (US); Jeongwon Lee, Boston, MA (US); Marin Soljacic, Belmont, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 13/787,399

(22) Filed: Mar. 6, 2013

(65) Prior Publication Data

US 2014/0126602 A1    May 8, 2014

Related U.S. Application Data

(60) Provisional application No. 61/723,811, filed on Nov. 8, 2012.

(51) Int. Cl.
*H01S 3/20* (2006.01)
*H01S 3/091* (2006.01)

(52) U.S. Cl.
CPC ..................... *H01S 3/091* (2013.01)
USPC .............................. 372/70; 372/53

(58) Field of Classification Search
CPC .................................... H01S 3/0947
USPC ...................................... 372/70, 53
See application file for complete search history.

(56) References Cited

U.S. PATENT DOCUMENTS

| 3,860,886 | A | * | 1/1975 | McColgin et al. | 372/53 |
| 3,913,033 | A | * | 10/1975 | Tuccio et al. | 372/53 |
| 4,878,224 | A |   | 10/1989 | Kuder et al. |  |
| 5,003,545 | A |   | 3/1991 | Kowalski |  |
| 5,020,062 | A | * | 5/1991 | Cusack et al. | 372/23 |
| 5,356,667 | A |   | 10/1994 | Hench et al. |  |
| 5,530,711 | A |   | 6/1996 | Scheps |  |
| 5,701,323 | A |   | 12/1997 | Kahr et al. |  |

(Continued)

FOREIGN PATENT DOCUMENTS

WO     WO99/49543     9/1999

OTHER PUBLICATIONS

Koschorreck, "Dynamics of a high-Q vertical-cavity organic laser", Oct. 27, 2005, Applied Physics Letters 87, 181108.*

(Continued)

*Primary Examiner* — Xinning Niu
*Assistant Examiner* — Vu A Vu
(74) *Attorney, Agent, or Firm* — Cooley LLP

(57) ABSTRACT

An organic dye laser produces a continuous-wave (cw) output without any moving parts (e.g., without using flowing dye streams or spinning discs of solid-state dye media to prevent photobleaching) and with a pump beam that is stationary with respect to the organic dye medium. The laser's resonant cavity, organic dye medium, and pump beam are configured to excite a lasing transition over a time scale longer than the associated decay lifetimes in the organic dye medium without photobleaching the organic dye medium. Because the organic dye medium does not photobleach when operating in this manner, it may be pumped continuously so as to emit a cw output beam. In some examples, operation in this manner lowers the lasing threshold (e.g., to only a few Watts per square centimeter), thereby facilitating electrical pumping for cw operation.

22 Claims, 6 Drawing Sheets

(56) References Cited

U.S. PATENT DOCUMENTS

| | | | |
|---|---|---|---|
| 5,943,354 A | | 8/1999 | Lawandy |
| 5,963,363 A | | 10/1999 | Weston et al. |
| 6,141,367 A | * | 10/2000 | Fan et al. ............... 372/53 |
| 6,790,696 B1 | | 9/2004 | Kahen |
| 6,963,594 B2 | * | 11/2005 | Manico et al. ............ 372/39 |
| 2001/0043635 A1 | | 11/2001 | Furumoto et al. |
| 2002/0176472 A1 | | 11/2002 | Arbore et al. |
| 2005/0152428 A1 | * | 7/2005 | Grot et al. ............... 372/92 |
| 2007/0165687 A1 | * | 7/2007 | Takezoe et al. ........... 372/53 |
| 2009/0323747 A1 | | 12/2009 | Nakanotani et al. |
| 2012/0120975 A1 | | 5/2012 | Oron et al. |
| 2012/0120979 A1 | | 5/2012 | Lee |

OTHER PUBLICATIONS

R. Bornemann et al., "High Power CW Tunable Solid-State Dye Lasers: From the Visible to UV," in Organic Photonics V, edited by B. P. Rand et al., Proc. of SPIE vol. 8435, pp. 84351F-1 to 84351F-6 (May 31, 2012).

International Search Report and Written Opinion, issued Dec. 27, 2013, in corresponding International Application No. PCT/US2013/029437.

Kopp, V. I. et al., "Low-threshold lasing at the edge of a photonic stop band in cholesteric liquid crystals", Optics Letters, vol. 23, No. 21, Nov. 1, 1998, pp. 1707-1709.

\* cited by examiner

CONTINUOUS-WAVE ORGANIC DYE LASERS AND METHODS

CROSS-REFERENCE TO RELATED PATENT APPLICATIONS

This application claims the benefit, under 35 U.S.C. §119 (e), of U.S. Provisional Application No. 61/723,811, filed Nov. 8, 2012, which application is hereby incorporated herein by reference in its entirety.

GOVERNMENT SUPPORT

This invention was made with government support under Grant No. DMR0819762 awarded by the National Science Foundation and under Contract No. W911NF-07-D-0004 awarded by the Army Research Office and under Grant Nos. DESC0001299 and DE-FG02-09ER46577 awarded by the Department of Energy. The government has certain rights in the invention.

BACKGROUND

Organic dye lasers with significant tunability in the visible wavelengths (e.g., covering the spectral region from ultraviolet to the near infrared) have attracted interest for many years due to their low-cost processing, flexible choice of substrates, and emission cross-sections. While practical implementation advantages would be realized by electrically-pumped organic semiconductor lasers, to date such lasers remain largely a theoretical curiosity and difficult to implement. This difficulty is due at least in part to the high thresholds of such lasers which are challenging to attain, particularly given large losses at the electrical contacts used to pump the organic semiconductor, low charge-carrier mobility in organic materials, and efficient exciton annihilation process in solid-state organic media.

One conventional approach for realizing organic lasers is the hybrid electrically-pumped organic laser. These lasers are optically pumped by small, electrically-driven inorganic diode lasers, which mitigates some of the challenges associated with direct electrically-pumped laser as discussed above. In any event, while optically-pumped organic lasers have been widely demonstrated, lasing is only possible with high peak power excitation sources of short pulses; furthermore, there has been no realization or demonstration of continuous-wave (CW) operated organic lasers without liquid dye circulation. This is because, in conventional dye lasers, continuous-wave pumping photobleaches the organic dye medium. Thus, to provide a continuous-wave output, the dye medium must be circulated through the excitation beam, e.g., in the form or a stream of liquid or a spinning disc of solid-state material.

SUMMARY

Embodiments of the present invention include continuous-wave organic dye lasers and methods of operating continuous-wave organic dye lasers. Such a laser may include a resonant cavity, an organic dye medium that is in optical communication with the resonant cavity, and an optical pump source that is in optical communication with the organic dye medium. The optical pump source is disposed with respect to the resonant cavity and the organic dye medium such that, during operation of the laser, the optical pump source excites the organic dye medium with a continuous-wave pump beam that is stationary with respect to the organic dye medium so as to stimulate emission of a continuous-wave output beam by the organic dye medium. And the organic dye medium may be disposed with respect to the resonant cavity such that, during operation of the laser, the continuous-wave output beam resonates within the resonant cavity.

In some cases, the resonant cavity is characterized by a total quality factor $Q_{tot}$ of about $5\times10^3$ to about $5\times10^6$. As understood by those of ordinary skill in the art, the quality factor is a measure of the sharpness or selectivity of the resonant cavity's resonance. The resonant cavity may also be characterized by a spontaneous emission enhancement factor $F_p$ of about 1 to about 100. As understood by those of ordinary skill in the art, the spontaneous emission enhancement factor, which is greater than or equal to 1, represents an increase in the spontaneous emission rate near the lasing frequency compared to the free-space spontaneous emission rate due to changes in the optical density of states (DOS). This increase in the spontaneous emission rate may be due the resonant cavity's structure or shape (e.g., as in the case of a photonic crystal resonant cavity).

Suitable organic dye media comprise liquids and solids at various dye concentrations. For instance, the organic dye medium may have a dye concentration of about 0.1 mM to about 10 mM. The organic dye medium may also be characterized by a lasing mode confinement factor $\Gamma_s > 0.1$; this lasing mode confinement is the fraction of the total spatial modal energy (of the lasing mode) that overlaps the organic dye medium (in space). The organic dye medium may also include at least one quenching molecule to quench at least one undesired transition caused by absorption of the continuous-wave pump beam by the organic dye medium.

The continuous-wave organic dye lasers may generate continuous-wave output beams that can be tuned in amplitude and/or wavelength. For example, the optical pump source may comprises a tunable optical pump source whose output wavelength can be tuned so as to vary the amplitude of the continuous-wave output beam. The laser may also include an actuator, such a piezoelectric device, to change the resonant cavity's length (e.g., by moving a mirror) so as to vary a wavelength of the continuous-wave output beam.

Other embodiments of the present invention include a laser (and associated methods) that comprises a resonant cavity, a liquid or solid organic gain medium that is in optical communication with the resonant cavity (e.g., disposed in the resonant cavity), and a pump source, such as an optical or electrical source, that is in optical and/or electrical communication with the organic gain medium. The resonant cavity is characterized by a spontaneous emission coupling factor $\beta$, which represents the portion of spontaneously emitted photons that couple into a targeted mode, and a spontaneous emission enhancement factor $F_p$ (defined above). The organic gain medium is characterized by a population $N_{tot}$ of absorbers available of excitation and a confinement factor $\Gamma_s$ (defined above). In operation, the pump source excites a transition of the organic gain medium characterized by a total emission lifetime $\tau_{spont}$, a triplet decay lifetime $\tau_t$, and an intersystem crossing lifetime $\tau_{isc}$ so as to produce at least one lasing photon having a loss rate due to loss in the resonant cavity and absorption in the organic gain medium of $1/\tau''_{loss}$. These parameters satisfy the inequality:

$$\frac{\beta F_p \Gamma_s N_{tot}}{\tau_{spont}} > \frac{(1 + \tau_t / \tau_{isc})}{\tau''_{loss}}.$$

In some cases, the spontaneous emission enhancement factor $F_p$ is greater than 1, the total emission lifetime $\tau_{spont}$ is about 0.1 ns to about 10 ns, the triplet decay lifetime $\tau_t$ is about 100 ns to about 10 ms, the intersystem crossing lifetime $\tau_{isc}$ is about 10 ns to about 1 ms, and the loss rate $1/\tau''_{loss}$ is about $5 \times 10^8$ s$^{-1}$ to about $5 \times 10^{13}$ s$^{-1}$.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

DETAILED DESCRIPTION

The framework disclosed herein relevant to various embodiments of the present invention applies time-dependent perturbation theory to describe the interaction of organic dye molecules with a cavity (e.g., a micro-structured cavity) to produce single-mode lasing. This framework incorporates both the chemical properties of the organic dye and optical properties of the laser's resonant cavity. It also provides analytic expressions of the threshold and slope efficiency that characterize the organic dye lasers disclosed herein, and also the duration over which lasing action can be sustained before the organic dye photobleaches. Without being bound by any particular theory, implementations of these analytic expressions yield continuous wave (CW) laser emission from an organic medium excited by a continuous-wave optical pump beam, and further illustrate lasing with a threshold of only a few W/cm$^2$.

Continuous-Wave Organic Lasers

Figure 1A:
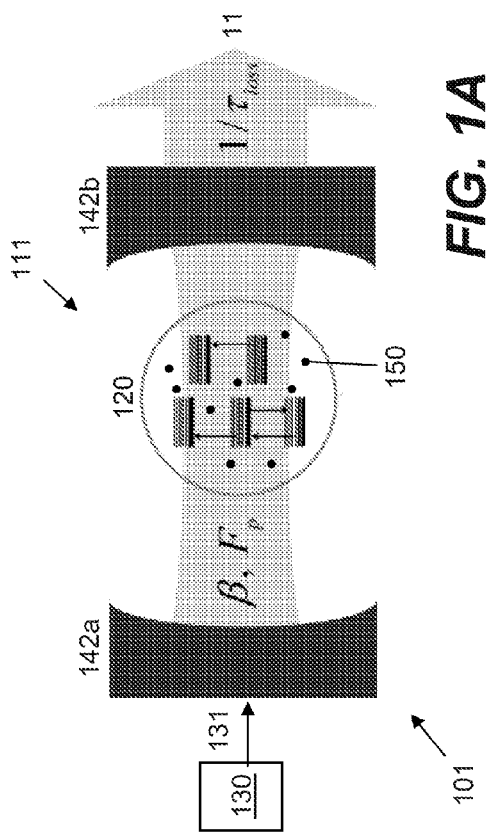
FIGS. 1A-1C illustrate continuous-wave, optically pumped laser systems according to embodiments of the present invention.

FIG. 1A shows an organic dye laser 101 that emits a continuous-wave output beam 11. The organic dye laser 101 includes an organic gain medium 120 electromagnetically coupled to a resonant cavity 111. The organic gain medium 120 can be a liquid, such as a liquid dye medium, or a solid-state organic material. Suitable organic gain media include, but are not limited to exalite, coumarin, rhodamine (e.g., rhodamine 6G, or R6G), pyrromethene, pyridine, fluorescein, pyridine, and styryl. As understood by those of ordinary skill in the art, these organic gain media can be dissolve into suitable solvents, including water, glycol, methanol, ethanol, p-dioxane, and dimethylsulfoxide, or doped in suitable crystal hosts, including KDP and various polymers. The organic gain medium's output wavelength can be in the ultraviolet, visible, or infrared portion of the electromagnetic spectrum. For example, coumarin 2, 47, 102 or 153 is suitable for lasers emitting light in the blue to green portions of the visible spectrum.

The organic gain medium 120 may also include one or more quenchers 150 (quenching molecules). As understood by those of ordinary skill in the art (and explained in greater detail below), quenchers deplete the number of gain molecules in the triplet state faster than usual. This enhances continuous-wave lasing by limiting or reducing absorption of the pump beam 131 by triplet-state gain molecules, which may never lase. It also reduces the likelihood that the triplet-state gain molecules will bleach. Suitable quenchers include but are not limited to oxygen, ammonyx LO, propylene carbonate, propylene glycol, ethylene glycol, COT-cyclooctatetraene, and 9-methylanthracene. In general, the ratio of quencher to dye is about 3:1. For Rhodamine 6G at a concentration of $0.1 \times 10^{-1}$ mM, this gives a quencher concentration of about $0.3 \times 10^{-1}$ mM. Other quencher concentrations are also possible; for instance, an oxygen quencher concentration may range from about 0.25 mM to about 1.5 mM.

In this case, the organic dye medium 120 is disposed in the resonant cavity 111, which is defined by a pair of mirrors 142a and 142b. These mirrors 142a, 142b may be curved, as shown in FIG. 1A, to focus the resonating output beam 11. They may also be flat (planar) mirrors (e.g., like mirrors 144a and 144b in FIGS. 1B and 1C). The mirrors 142a, 142b can be formed of periodically structured dielectric material, such as a one-dimensional Bragg stack of quarter-wave thick, high- and low-index dielectric layers. They can also be formed on two- or three-dimensionally periodic structures, also known as photonic crystals.

If the organic dye medium 120 comprises a liquid, the laser 101 may also include a transparent or translucent vessel to hold the liquid. This vessel and its surfaces may define the boundaries of the resonant cavity—for instance, the vessel's surfaces may reflect at least a portion of the output beam 11 so as to cause the output beam 11 to resonate within the vessel. At least one of the vessel's surfaces may transmit light at the pump wavelength. If desired, the vessel can include a microcavity in a one-, two-, or three-dimensional photonic crystal structure. The vessel could also be made from glass or plastic coated with suitable dielectric coating(s) on its surface(s).

The organic laser 101 also includes an optical pump source 130, such as a flashlamp or tunable laser diode, that excites the organic gain medium 120 with a continous-wave pump beam 131. This pump beam 131 may have an intensity that ranges from a few Watts/cm$^2$ to tens of thousands Watts/cm$^2$. The pump source 130 transmits this pump beam 131 through one mirror 142a, which transmits light at the pump wavelength and reflects light at the output wavelength. The pump beam 131 excites the organic gain medium 120, causing the organic gain medium 120 to emit the output beam 11. If the excitation exceeds the organic gain medium's lasing threshold, the organic gain medium's output beam 11 is a continuous-wave laser beam.

In some cases, the pump source 130 may be a tunable pump source, such as a tunable diode. As understood by those of skill in the art, the wavelength of the such a diode's output (the pump beam 131) can be tuned by changing the diode's temperature, e.g., by heating the diode or by increasing the current running through the diode. The diode's output wavelength can also be varied by feeding back a portion of the output into the diode, e.g., using an external grating or reflector. Tuning the pump beam's wavelength changes the efficiency with which the organic gain medium 120 absorbs incident pump photons; as the pump photons move off resonance, the organic gain medium 120 is less likely to absorb them, leading to a decrease in the laser's output power. Similarly, changing the pump beam intensity will also affect the intensity of the laser's output beam 11.

Unlike other organic dye lasers, the organic dye laser 101 does not require any moving parts—the organic dye medium 120 does not move with respect to the pump beam 131 (or, in this embodiment, with respect to the pump source 130). In other words, the pump beam 131 and the organic dye medium 120 are stationary with respect to each other. Nevertheless, the laser 101 emits a continous-wave output beam 11. This is because the cavity's emission coupling factor β and spontaneous emission enhancement factor $F_p$, the organic gain medium's population $N_{tot}$ and confinement factor $\Gamma_s$, and the excited transition's total emission lifetime $\tau_{spont}$, intersystem crossing lifetime ratio $\tau_t/\tau_{isc}$, and total absorption loss lifetime $\tau''_{loss}$ are selected to prevent photobleaching of the organic dye medium 120 as explained below. In some examples, this includes choosing these parameters to satisfy the following inequality:

$$\frac{\beta F_p \Gamma_s N_{tot}}{\tau_{spont}} > \frac{(1 + \tau_t/\tau_{tsc})}{\tau''_{loss}}.$$

The organic dye medium 120 emits a continuous-wave output beam 11 so long as it is pumped continuously and remains unbleached.

For instance, the resonant cavity may be characterized by a total quality factor $Q_{tot}$ of about $5 \times 10^3$ to about $5 \times 10^6$ and a spontaneous emission enhancement factor $F_p$ of about 1 to about 100. Practical total quality factor values ranges from about 100 to about 10,000,000. However, depending on the other laser parameters, lasing may only be possible when the total quality factor is high enough. In these situations, the quality factor's lower bound may depend on the particular system, e.g., as discussed with respect to FIGS. 6A-6D and 7A-7D. Similarly, the dye concentration (which affects the organic gain medium's total population $N_{tot}$) depends on the dye itself and on the other laser parameters. Typical dye concentrations may range from about 0.1 mM to about 10 mM for R6G solution. The organic dye medium may be characterized by a lasing mode confinement factor $\Gamma_s > 0.1$, e.g., 0.3, 0.4, 0.5, 0.6, or higher.

Figure 1C:
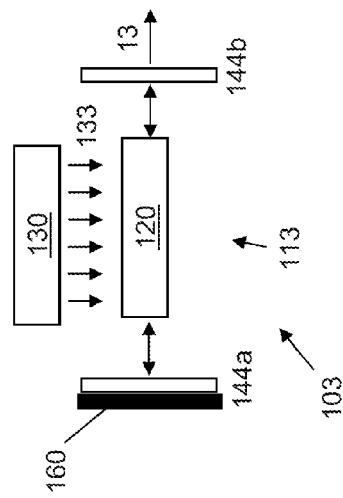
Figure 1B:
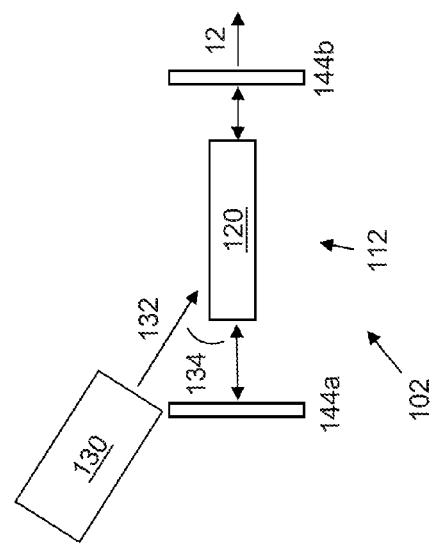

FIGS. 1B and 1C illustrate continuous-wave organic lasers 102 and 103, respectively, with alternative resonant cavity configurations 112 and 113, respectively. Like the laser 101 shown in FIG. 1A, the laser 102 shown in FIG. 1B includes an organic gain medium 120, such as a liquid dye or solid-state organic material, that is optically pumped with a continuous-wave pump beam 132 from an off-axis pump source 130, which may be another laser, diode, or lamp. The pump beam 132 excites a transition in the organic gain medium 120, and the organic gain medium 120 responds to this excitation by emitting a continuous-wave output beam 12 that resonates inside a cavity 102. This resonant cavity 102 is formed by at least two reflecting surfaces, shown here as planar mirrors 144a and 144b. The left-hand mirror 144a reflects substantially all (e.g., 99% or more) of the incident light, whereas the right-hand mirror 144b transmits a portion (e.g., 1-5%) of the incident light as the output beam 12.

Like the pump beam 131 shown in FIG. 1A, the continuous-wave pump beam 132 in FIG. 1B is stationary with respect to the organic gain media 120. Unlike the pump beam 131 in FIG. 1A, however, the pump beam 132 in FIG. 1B does not propagate co-linearly with the output beam 11. Instead, the pump beam 132 propagates at an angle 134 with respect to the output beam 11. This interbeam angle 134 can be changing by translating or rotating the pump source 130 with respect to the gain medium 120 by moving either the pump source 130 or the gain medium 120 or by using a mirror, prism, or other optical element (not shown) to steer the pump beam 132 with respect to the organic gain medium 120. Changing this interbeam angle 134 may allow more pump energy to couple into the organic gain medium 120, enabling continuous-wave operation to be attained at a lower pump intensity. This reduction in pump intensity may in turn enable a lower operating temperature.

FIG. 1C shows a laser 103 in which the organic gain medium 120 is illuminated broadside by a continuous-wave pump beam 133 from an optical pump source 130, such as a flashlamp. The pump beam 133 stimulates emission of a continuous-wave output beam 13 from the laser 103. As in the lasers discussed above, the broadside pump beam 133 and the organic gain medium 120 do not move with respect to each other. And as discussed above, the laser's operating parameters are chosen to satisfy the inequality given above so as to provide continuous-wave operation without streaming or spinning the organic gain medium (dye) through or past the pump beam 133.

The laser 103 in FIG. 1C also includes an actuator 160, such as a piezoelectric device, that moves the mirror 144a back and forth. As understood by those of skill in the art, moving the mirror 144a changes the length of the resonant cavity 113, which in turn may causes the wavelength of the output beam 13 to change (provided that the wavelength supported by the resonant cavity 113 is within the organic gain medium's gain band). Thus, the actuator 160 can be used to tune the wavelength of the output beam 13 or to lock the wavelength of the output beam 13 to a reference source using techniques known in the art.

Organic Gain Media Coupled to Photonic Crystal Resonators

Figure 2:
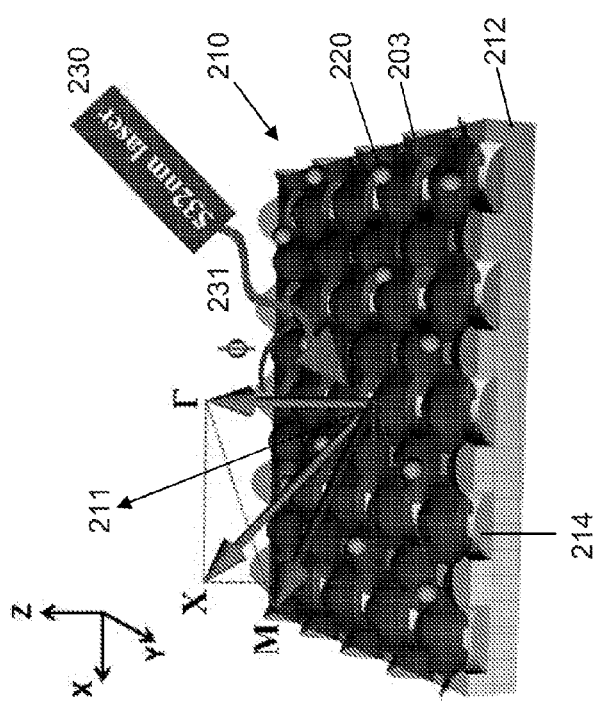
FIG. 2 shows a photonic-crystal organic dye laser according to embodiments of the present invention.

FIG. 2 is a schematic diagram of a photonic crystal organic dye laser 201 configured for continuous-wave operation without moving parts. The laser 201 includes a photonic crystal 210 whose photonic band structure includes a Fano resonance at or near a wave vector of k=0 (i.e., at or near the Γ point). This photonic crystal 210 includes a dielectric substrate 212 with a large area that is uniformly patterned with holes 214 arrayed on a square lattice. The Fano resonance's energy density surface 203 has troughs over the holes 214 in the photonic crystal 210 and peaks over the dielectric material surrounding the holes 214.

In one example, the substrate 212 includes a 250 nm thick slab of $Si_3N_4$ with periodic cylindrical holes 214 on top of 6 μm thick $SiO_2$ layer. The holes 214 are spaced at an average period of 320 nm, with an average hole diameter of 160 nm and an average hole depth of 55 nm. These uniformly periodic hole patterns may extend over several square centimeters (e.g., 1, 2, 3, 4, or 5 $cm^2$). Those of ordinary skill in the art will readily appreciate that other hole spacings, diameters, and depths are possible, as are slabs of other materials, thicknesses, and areas.

The dielectric substrate 212 defines a surface to hold organic gain media, shown in FIG. 2 as organic dye molecules 220. For instance, the organic dye molecules 220 may be Rhodamine 6G (R6G) dissolved in methanol at 1 mM concentration and placed on top of the photonic crystal 210. This solution may be suspended or coated onto the substrate's surface so as to electromagnetically couple the dye molecules 220 to the photonic crystal resonance. For instance, if the solution is a liquid, it may be held in place by walls or a vessel (not shown) or even by adhesive forces between the substrate 212 and the dye molecules 220. The solution can also be made into a gel so that it sticks to the substrate 212 or allowed to dry on the substrate 212 so as to form a dye-molecule film on the substrate's surface.

Irradiating these dye molecules 220 with continuous-wave pump radiation 231 from a radiation source, which may be a coherent light source (e.g., a pump laser 230) or an incoherent light source (e.g., a light-emitting diode, flash lamp, a white-light source, a supercontinuum source, etc.), stimulates continuous-wave emission 211 from the dye molecules 210. In some embodiments, the pump beam 231 illuminates the entire portion of the photonic crystal 210 coated with dye molecules 220. Thus, even if the dye molecules 220 are not fixed with respect to the photonic crystal 210 or the pump source 230 (e.g., because they are in a liquid solution), they remain illuminated by the pump beam 231 even if they move across the photonic crystal's surface. The dye molecules 220 do not circulate, as in a conventional dye laser; rather, they simply move randomly (if at all) within the pump beam's profile. Thus, for the purpose of this disclosure, dye molecules 220 in liquid solution are stationary with respect to the pump beam 231 in this situation. Gel-based and solid-state organic dye molecules 220 are also static with respect to the pump beam 231 in this configuration.

As noted above, the organic dye molecules 220 are electromagnetically coupled to the Fano resonance provided by the photonic crystal. If the Fano resonance frequency coincides with the frequency of the organic dye molecules' lasing transition, then the pump beam 231 excites the photonic crystal's resonance mode, resulting in a local field enhancement near the photonic crystal's surface. This enhanced local field results in increased absorption by the organic dye molecules 230. This resonant enhancement of the organic dye molecules' absorption is called excitation enhancement of incident radiation for the source. The Fano resonance may also lead to a modified spectral density of states, which may provide extraction enhancement by restricting the molecule's output beam 211 to a relatively small solid angle. For more on excitation enhancement and extraction enhancement, see U.S. application Ser. No. 13/768,725, filed on Feb. 15, 2013, and entitled "Excitation Enhancement and Extraction Enhancement with Photonic Crystals," which is incorporated herein by reference in its entirety.

Electrically Pumped, Continuous-Wave Organic Lasers

Figure 3:
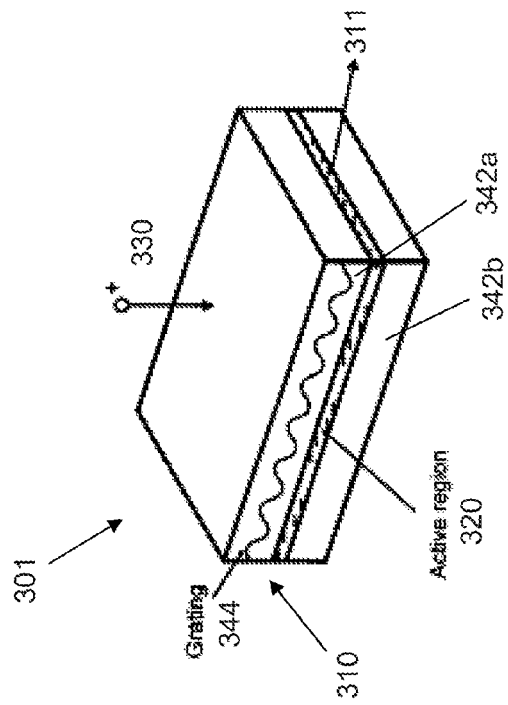
FIG. 3 shows an electrically pumped, solid-state organic laser according to embodiments of the present invention.

FIG. 3 shows an electrically pumped distributed feedback (DFB) laser 301 that includes a solid-state organic gain medium (active region 320). The active region 320 may include organic dye molecules or other organic light-emitting material that is disposed between an upper cladding region 342a and a lower cladding region 342b. The upper cladding region 342a is patterned or corrugated periodically to form a grating 344 as shown in FIG. 3. Together, the cladding regions 342a and 342b and the grating form a resonant cavity 310 electromagnetically coupled to the active region 320. The laser 301 also includes an electrode 330 in electrical communication with the active region 320.

In operation, current flows from the electrode 330 through the active region 320 to ground (not shown). This current excites the active region 320, which responds to the stimulation by emitting continuous-wave light into the resonant cavity 310. The grating 344 diffracts a narrowband portion of this emission back into the active region 320. This diffraction sets up a feedback loop that yields a single-mode, continuous-wave output beam 311 as understood by those of ordinary skill in the art. Those of ordinary skill in the art will readily appreciate that electrically pumped organic lasers may take other forms, including quantum-well devices, quantum cascade devices, and Fabry-Perot devices.

Like the other lasers disclosed herein, the organic DFB laser 301 emits a continuous-wave output 311. Again, this is because the cavity's emission coupling factor β and spontaneous emission enhancement factor $F_p$, the organic gain medium's population $N_{tot}$ and confinement factor $\Gamma_s$, and the excited transition's total emission lifetime $\tau_{spont}$, intersystem crossing lifetime ratio $\tau_t/\tau_{isc}$, and total absorption loss lifetime $\tau''_{loss}$ are selected to satisfy the following inequality:

$$\frac{\beta F_p \Gamma_s N_{tot}}{\tau_{spont}} > \frac{(1 + \tau_t/\tau_{isc})}{\tau''_{loss}}.$$

In some cases, the resonant cavity may be characterized by a total quality factor $Q_{tot}$ of about $5\times10^3$ to about $5\times10^6$ and a spontaneous emission enhancement factor $F_p$ of about 1 to about 100. And the dye concentration in the active region 320 may range from about 0.1 mM to about 10 mM. In addition, the active region 320 may be characterized by a lasing mode confinement factor $\Gamma_s > 0.1$, e.g., 0.3, 0.4, 0.5, 0.6, or higher. The active region 320 may also be doped with or include quenching molecules to inhibit or suppress undesired transitions in the active region 320.

Framework for Continuous-Wave Operation

Figure 4:
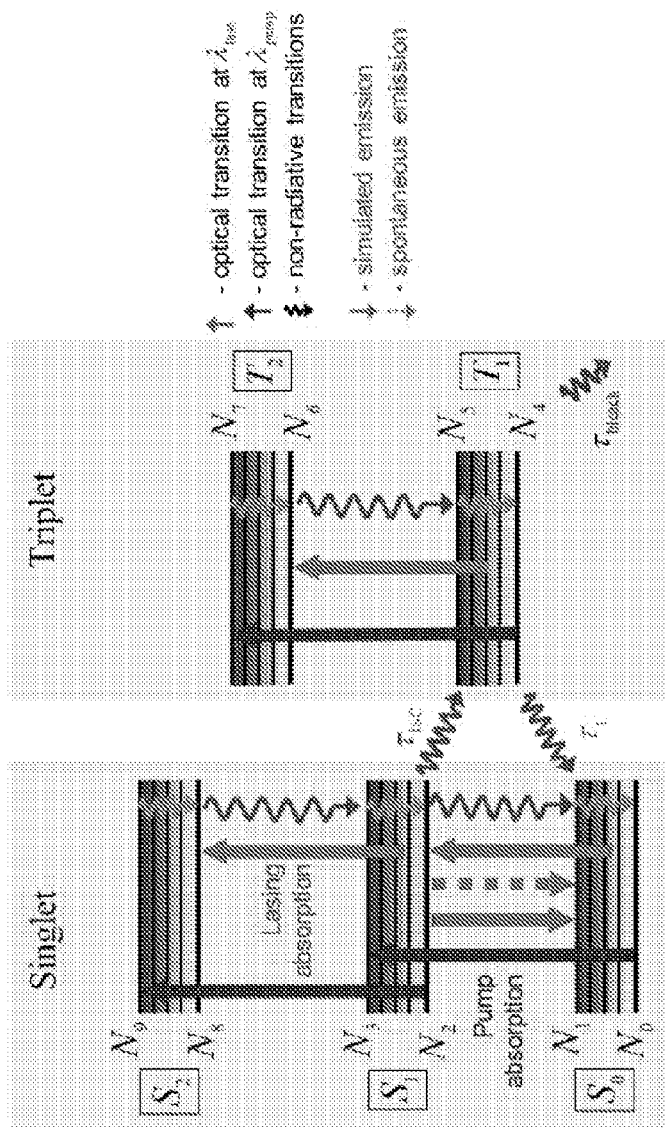
FIG. 4 illustrates the energy-level structure of the organic active medium suitable for use in the organic lasers of FIGS. 1A-1C, 2, and 3.

FIG. 4 illustrates the energy-level structure of an organic dye medium (e.g., organic dye medium 120 in FIGS. 1A-1C) suitable for use in continuous-wave organic lasers according to embodiments of the present invention. In this example, the energy-level structure includes three singlet states $S_0$, $S_1$, and $S_2$ and two triplet states $T_1$ and $T_2$. The left-hand (right-hand) solid vertical arrows are optically induced transitions at the excitation (lasing) wavelength whereas dashed vertical arrow indicate the organic molecules' radiative decay (spontaneous emission). Wavy arrows represent non-radiative transitions. The organic molecules' intersystem crossings from the singlet states to triplet states are characterized by the decay lifetime $\tau_{isc}$ while the subsequent decay of triplets back to the ground singlet state is characterized by $\tau_t$. Photobleaching in the organic dye medium 120 is modeled as the organic molecules' transition from the triplet state at a rate of $1/\tau_{bleach}$.

Often, a four-level gain model of only the two lowest singlet states ($S_0$ and $S_1$) suffices in analyzing systems where the influences of the triplet states are minimized, either by pulsed excitations with widths much shorter than the intersystem crossing lifetimes or by fast circulation of the dye solutions. Considering the full energy-level model shown in FIG. 4 makes it possible to identify parameters (from both molecular and optical standpoints) that can be optimized in order to simultaneously decrease the lasing threshold, increase the slope efficiencies, and reduce the photobleaching rates under continuous pumping in organic lasers without moving parts. While the model presented here represents fluorescing molecules dispersed in an amorphous environment, it can be easily adjusted to other configurations, including but not limited to solid-state $Alq_3$:DCM (based on Förster energy transfer) and crystalline organic molecules, by modifying the energy level model appropriately.

The various processes in the gain model are described via the rate equations which are presented in a form that is convenient for numerical analysis, and yet allow for direct relations to experimental parameters. The most general description of an energy level includes terms representing the optical transitions that are characterized by their absorption and emission cross-sections, as well as the radiative and non-radiative relaxations that are characterized by their lifetimes. Optical transitions of organic molecules to the upper states act as resonant absorbers of the excitation and emitted light while those to the lower states result in the stimulated emission of light, producing lasing photons when the pump power is above the threshold.

On the other hand, radiative relaxation of molecules to the ground singlet state leads to the spontaneous emission of light. The non-radiative processes considered are the internal conversions due to rotational and vibrational relaxations, the intersystem crossing of the molecules from the excited singlet state $S_1$ to the triplet state $T_1$, as well as their subsequent de-excitations back to the ground state $S_0$. Since $T_1$ is energetically closer to $S_1$ than $S_0$, the transition rate between $S_1$ and $T_1$ is typically faster than that between $T_1$ and $S_0$, resulting in build-up of the triplets population. High occupancies in the triplet states have three detrimental effects on lasing action: the population inversion becomes limited due to the smaller number of molecules in the singlet states, the fraction of the excitation light absorbed by the triplet states is increased, and dye absorption of the stimulated light is enhanced due to the overlapping emission and triplet-absorption spectrum. This framework allows for modifications of the intersystem crossing rates between the singlet and triplet states in order to reduce the effects of such triplet excited-state absorption. In organic dye solution for example, quenchers can be used to decrease the decay lifetime of the triplets. Photobleaching is also included in our analysis and is modeled as the loss of the molecules in the triplet state at a rate that is dependent on the excitation conditions, including the pump power level and the quencher (e.g., oxygen) level.

The organic gain model described above is coupled to the phenomenological rate equation describing the population of the lasing photons. These photons are produced by stimulated (above the threshold) and spontaneous emission, and at the same time, are resonantly re-absorbed by the organic media. In addition, the photons within the laser cavity are also lost due to radiation into the far-field, material absorption in actual devices, and scattering from fabrication disorders. Using the organic laser model of FIG. 4 and the notations below, lasing action is obtained as follows: dye molecules are primarily excited from $N_0$ to $N_3$ at a rate proportional to the pump power $P_{src}$. The excited molecules then decay nonradiatively into $N_2$ after a lifetime $\tau_{32}$. A net decay of molecules from $N_2$ to $N_1$ occurs through stimulated and spontaneous emission, as well as nonradiative relaxation. Some of the molecules in $N_2$ however, decay to the triplet state of $N_4$ and are trapped if $\tau_{isc} \ll \tau_t$. The resulting reduction in the number of molecules in the singlet states leads to a reduced population inversion, which implies a lower gain. Moreover, a high population of $N_4$ will also increase the lasing photon absorption and the number of molecules that are permanently lost through photobleaching. Molecules that do make it into $N_1$ then decay nonradiatively to $N_0$ with a lifetime $\tau_{10}$.

If the pumping rate exceeds the net decay rate of molecules in $N_2$, then a population inversion between $N_2$ and $N_1$ can be easily achieved because $N_2$ depopulates at a slower rate compared to $N_1$ and $N_3$ (i.e., $\tau_{21} \gg \tau_{10} \approx \tau_{32}$) to form a metastable state. Note that dye absorptions of the emitted lasing photons also occur in the singlet states where the molecules in $S_0$ and $S_1$ are optically excited to $S_1$ and $S_2$ respectively. Lasing occurs beyond a threshold $P_{src}^{thr}$ when the population inversion between $N_2$ and $N_1$ leads to a gain that is sufficiently large to overcome the total losses in the dye and cavity.

Sub-Wavelength Structured Cavity Effects

In embodiments with sub-wavelength structured cavities (e.g., photonic crystal resonators), the sub-wavelength structured cavity may affect the excited state lifetime emission of the molecules. The optical density of states (DOS) is typically modified in such structures and leads to modification of the spontaneous emission when compared to their free-space emission, which requires consideration in the rate equations. This modification of the spontaneous emission rate near the lasing frequency $f_l$ can be quantified by the spontaneous emission enhancement factor $F_p$. Including this spontaneous emission enhancement factor in the model allows the study of the spontaneous emission enhancement factor's impacts on the onset of lasing in novel nanostructured cavity designs. The enhanced spontaneous emission rate at $f_l$ in the presence of a suitably designed cavity for such purpose is $$\gamma_{f_l}^{cav} = \frac{\gamma_{f_l}^{cav}}{\gamma_{allmodes}^{cav}} \times \frac{\gamma_{allmodes}^{cav}}{\gamma_{allmodes}^{cav}} \times \gamma_{allmodes}^{bulk} = \beta \times F_p \times \frac{1}{\tau_{spont}} \quad (1)$$

where $\beta$ is the spontaneous emission coupling factor, $\gamma_{allmodes}^{bulk} = 1/\tau_{spont}$, is the total emission rate of the bulk organic media, $\gamma_{allmodes}^{cav}$ is the total emission rate in the presence of a cavity, and $\gamma_{f_l}^{cav}$ is the emission rate into the lasing mode. In regular large cavity where no enhancement of the spontaneous emission exists, $F_p = 1$.

Continuous-Wave Lasing System (Steady-State Analysis)

An analytic threshold expression that accounts for the relevant chemical properties of the organic molecules and the optical properties of the cavities can be used to identify the relative importances of the various parameters in lowering the threshold under practical constraints. These constraints include the upper limit placed on the quality factor of a cavity, the relative intersystem crossing lifetimes $\tau_t/\tau_{isc}$, and the highest concentration of organic dye that one can use without reducing the dye's quantum yield. Similarly, an expression for the lifetime of an organic dye before it photobleaches will allow one to better design a system to prolong the duration over which lasing action is possible. This steady-state analysis is separated here into two parts: (1) predictions of the threshold and slope efficiency assuming no photobleaching, and (2) a prediction of the time the dye takes to photobleach.

Threshold without Photobleaching

The relatively slow photobleaching process can be ignored in the predictions of thresholds since $\tau_{bleach}$ is typically a few milliseconds (in air saturated solution at room temperature) while the next longest lifetime is $\tau_t$, which varies between $10^{-7}$ to $10^{-4}$ seconds (in R6G) depending if the dye is solid-state or in solution, or if a quencher is added. In other words, the effects of photobleaching kick in after the lasing actions begin. Under such an assumption, the total molecular population is conserved in this model (i.e., $dN_{tot}/dt=0$) such that the gain becomes saturable at high pump rate. Confining the laser's operation to the regime near the lasing threshold makes it possible to assume that the effects of the gain medium on the field remain linear. It is also assumed $N_{tot}=N_{tot}^{den} \times V = N_0+N_2+N_4$. Since molecules in the other levels are depleted due to their fast relaxation rates, this assumption should breaks down only at very high excitation power.

Under these assumptions, the steady state threshold power $P_{src}^{thr}$ can be found by extrapolating the linear input-output power curve to zero output:

$$\frac{\eta^{S_0 S_1} P_{src}^{thr}}{hf_p} = \frac{(F_p/\tau_{spont} + 1/\tau_{21} + 1/\tau_{isc})/\tau'_{loss}}{F_p \beta V \Gamma_s/\tau_{spont} - (1+\tau_t/\tau_{isc})/N_{tot}^{den} \tau''_{loss}} \times V \quad (2)$$

where $1/\tau'_{loss}=1/\tau_{loss}+v_g \sigma_{abs}^{S_0 S_1} \Gamma_s N_{tot}^{den}$ and $1/\tau_{loss}''=1/\tau_{loss}+v_g \sigma_{abs}^{T_1 T_2} \Gamma_s N_{tot}^{den}$ are the total loss-rates of the lasing photons due to cavity losses and absorption in the organic medium. In deriving Eq. (2), $\beta \Gamma_s$ is assumed to be much less than one and the relative magnitudes of the self-absorption cross sections are assumed to follow those in TABLE 1 for R6G in solution. Since $\sigma_{abs}^{S_1 S_2} \approx \sigma_{abs}^{T_1 T_2}$, the total photon loss rates in both the $S_1 S_2$ and $T_1 T_2$ states may be represented by $1/\tau_{loss}''$. In addition, the $\beta V$ quantity is regarded to be volume-independent because $\beta$ generally scales as the inverse of V. From the denominator of Eq. (2), it becomes clear that lasing can be realized in systems that satisfy $$\frac{F_p \beta \Gamma_s N_{tot}}{\tau_{spont}} > \frac{(1+\tau_t/\tau_{isc})}{\tau''_{loss}}. \quad (3)$$

The relationship in Eq. (3) implies that the intrinsic losses should be lower than the maximum available gain to achieve lasing. To overcome this, one should strive to increase the concentration of the organic media (while taking care to maintain the same quantum yield), increase the confinement and $\beta$ factors through optimizing the cavity designs, and reduce the losses in both dyes and cavities.

Efficiency without Photobleaching

The quantum efficiency of the laser is proportional to the linear slope of the input-output power relationship above threshold. It can be expressed as $$q_{lase} = \frac{\text{no. of emitted lasing photons}}{\text{no. of absorbed pumping photons}} \quad (4)$$

$$= \frac{\Delta P_{out}}{\Delta P_{src}} \cdot \frac{f_p}{f_l}$$

$$= \frac{\eta^{S_0 S_1}}{\tau_{cav}^{rad} \Gamma_s} \times \frac{F_p \beta V \Gamma_s/\tau_{spont} - (1+\tau_t/\tau_{isc})/N_{tot}^{den} \tau''_{loss}}{F_p \beta V/\tau_{spont} \tau_{loss} + v_g \sigma_{abs}^{S_0 S_1} \left[\begin{array}{c} 1/\tau_{loss} + \\ (1+\tau_t/\tau_{isc})/\tau''_{loss} \end{array}\right]}.$$

The numerator in the second fraction of Eq. (4) is equivalent to the denominator of the threshold expression in Eq. (2), consistent with the well-known fact that a low-threshold lasing system also has a high slope efficiency. In fact, replacing the second fraction in Eq. (4) with the total photon-loss lifetime of the laser system $\tau_{loss}^{tot}$ yields a simple relationship for the slope efficiency: $\Delta P_{out}/\Delta P_{src} \propto \eta^{S_0 S_1} \tau_{loss}^{tot}/\tau_{cav}^{rad} \approx \eta^{S_0 S_1} P_{cav}^{rad}/P_{loss}^{tot}$. In other words, the laser's slope efficiency depends on both the fraction of pump power that is absorbed by the organic medium and the fraction of the emitted power that is radiated into the far-field. It is, however, independent of the quantum yield in the gain medium and its volume.

Introducing Photobleaching

Include the photobleaching channel in $N_4$ makes it possible to represent a molecule's permanent loss from further participation in stimulated emission. In this case, the total molecular population is no longer conserved but reduces according to $dN_{tot}/dt=-N_4/\tau_{bleach}$, where $\tau_{bleach}$ can be markedly different depending on the environment of the dyes (see below). This sets the time scale $\tau_{system}^{bleach}=\tau_{bleach} N_{tot}/N_4$ beyond which the dye photobleaches and the emitted signal is permanently quenched. Note that $N_4$ and $N_{tot}$ are time-dependent quantities. However, to obtain an approximate analytic expression for the lasing lifetime (under CW operations) at pump powers above the threshold, the steady-state populations of $N_4$ and $N_{tot}$ under the condition in Eq. (1) are used. The validity of such an approximation compares well to the numerically predicted photobleaching rates using the full rate equations. In addition, this model predicts $\tau_{system}^{bleach}$ to decrease linearly with the excitation power when operating below the lasing threshold. This linear trend of the bleaching rate with pump power is consistent with other experimental observations. The photobleaching lifetime upon lasing (a volume-independent quantity) can be expressed as $$\tau_{lase}^{bleach} = \tau_{bleach} \times F_{lase}^{bleach} \quad (5)$$

$$\approx \tau_{bleach} \times \frac{N_{tot}^{den} \Gamma_s \tau'_{loss}}{\tau_t/\tau_{isc}} \times \left[\frac{F_p \beta V}{\tau_{spont}} - v_g \sigma_{abs}^{T_1 T_2}\left(1+\frac{\tau_t}{\tau_{isc}}\right)\right].$$

(Note that $\tau_{lase}^{bleach} < 0$ long the systems considered can realize lasing, i.e., Eq. (3) is satisfied).

Beyond this lifetime, the dye photobleaches and lasing shut down. $F_{lase}^{bleach}$ is the modification to $\tau_{bleach}$ afforded by the specific design of the laser system; it depends on the dye concentration and intersystem crossing lifetime ratio ($\tau_t/\tau_{isc}$), as well as the cavity's quality factor, confinement factor, spontaneous emission coupling factor and $F_p$. Again, the relative values of the absorption cross-sections in TABLE 1 are assumed in Eq. (5). The quantum efficiency of dye bleaching may similarly be derived as $$q_{bleach} = \frac{\text{no. of photobleached molecules}}{\text{no. of absorbed pumping photons}} \approx \frac{N_{tot} hf_p}{\tau_{system}^{bleach} \eta^{S_0 S_1} P_{src}}. \quad (6)$$

Note that $q_{bleach}$ is independent of the organic concentration. Its reciprocal $1/q_{bleach}$ provides an estimate of the number of times a molecule is recycled from $S_0$ to $S_1$ and back to $S_0$ before it is lost. Since $\tau_{system}^{bleach} \propto 1/P_{src}$ as noted above, $q_{bleach}$ in Eq. (6) is also independent of the excitation power (below the threshold).

Pulsed Lasing System

Most lasing experiments involving organic gain materials are excited by short pulses, except for systems where liquid dye circulation exist. The key difference of the analysis in this section to that of the steady-state is that the undesirable triplet influences can now be minimized when the excitation pulse-width $\tau_{pulse}$ is shorter than the intersystem crossing lifetime $\tau_{isc}$ required by the singlet excitons to decay into the triplet states. This decoupling between the singlet and triplet states can be represented here by setting $\tau_{isc}$ to large values so that $N_{tot}^{pulse} = N_0 + N_2$ at all times and no photobleaching takes place within the short lifespan of the lasing pulse signal. Physically, a large $\tau_{isc}$ implies a quasi steady-state regime where the pulse length is assumed to be longer than all decay lifetimes of the molecules but remains shorter than $\tau_{isc}$. The self-absorption of the lasing photons in $S_1 S_2$ is sometimes neglected because the population of $S_0$ is much greater than that of $S_1$ so that $N_0 \sigma_{abs}^{S_0 S_1}$ is the more dominating photon loss term in Eq. (18). As a result, a four-level gain model of the lower singlet states usually suffices in capturing the main lasing mechanisms. Including the photon absorption in $S_1 S_2$ (since in some dyes such as R6G show that it plays a non-diminishing role on the $\sigma_{abs}^{S_1 S_2} \ll \sigma_{abs}^{S_0 S_1}$ in some dyes such as R6G show that it plays a non-diminishing role on the threshold values when $1/\tau_{loss}$ in $1/\tau_{loss}''$ becomes relatively small (i.e., $1/\tau_{loss}'' \approx v_g \sigma_{abs}^{S_1 S_2} \Gamma_s N_{tot}/V$). For instance, this happens when $Q_{tot} = 2\pi f_1 \tau_{loss} > 5 \times 10^5$.

By setting $\tau_{isc}$ to infinity in Eq. (2), the threshold pulse energy in the quasi steady-state regime is approximated as $$U_{pulse}^{thr} = P_{src}^{thr} \tau_{pulse} \approx \frac{hf_p \tau_{pulse}}{\eta^{S_0 S_1}} \times \frac{(F_p/\tau_{spont} + 1/\tau_{21})/\tau_{loss}'}{F_p \beta V \Gamma_s/\tau_{spont} - 1/N_{tot}^{den} \tau_{loss}''} \times V. \quad (7)$$

In most pulsed lasing systems, $\tau_{pulse}$ and $\tau_{spont}$ are in fact both on the order of a few nanoseconds and so, the quasi steady-state approximation applied in Eq. (7) leads to an underestimation of the threshold pulse energy. Nonetheless, Eq. (7) is still useful in identifying the key molecular and photonic parameters needed to lower the lasing threshold. Similar to the steady-state regime of Eq. (3), lasing can only take place in systems where the maximal potential gain is greater than the total cavity and molecular losses where $F_p \beta \Gamma_s N_{tot}/\tau_{spont} > 1/\tau_{loss}''$. Unlike in Eq. (3), these losses are no longer influenced by the triplet states.

Steady-State Operation of a Rhodamine 6G (R6G) Organic Dye Laser

This section includes an analysis of the steady-state operation of an R6G organic laser in terms of its threshold and the duration over which lasing action can be sustained before the dye photobleaches. The optical and chemical properties of the system in Eqs. (2) and (5) are varied and their impacts on the lasing performances are studied. The parameter values used in these examples are listed in TABLE 1 (below) for R6G in solution.

Figures 5A, 5B:
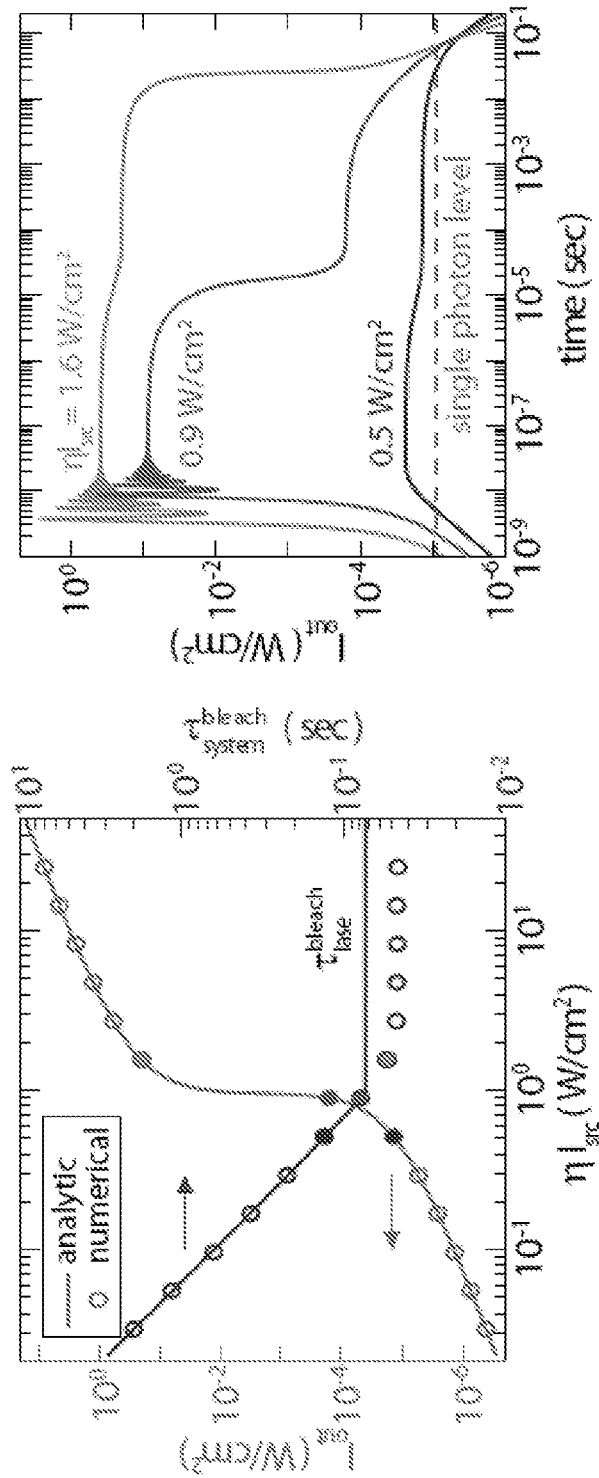
FIG. 5A is a plot of output intensity $I_{out}$ (left axis) and photobleaching lifetime (right axis) of the organic active medium in FIG. 4 as a function of the excitation intensity $I_{src}$ under continuous excitation.
FIG. 5B is a plot of output intensity versus time for three values of the pump power absorbed by the active gain medium for the organic active medium in FIG. 4.

FIGS. 5A and 5B are plots that verify of the steady-state analytic expressions derived above with comparisons of analytic solutions to the numerical solutions of the full model. FIG. 5A is a plot of the laser's output intensity $I_{out}$ (left axis) and photobleaching lifetime (right axis) as a function of the excitation intensity $I_{src}$. The plotted output intensity corresponds to the quasi steady-state values before the laser emission is quenched (see FIG. 5B, described below). In this example, $\tau_t$ is 10 µs so that $\tau_t/\tau_{isc}=100$ and the threshold is near 1 W/cm². Plotting the results against $\eta I_{src}$ in FIG. 5A represent an implicit assumption that the incident power is completely absorbed by the dye. When $\eta < 1$, the threshold intensity may be scaled by $1/\eta$. For instance, if only 10% of the incident power is absorbed by the dye laser, then the threshold becomes 10 W/cm². In this example, the quantum slope efficiency of the laser (calculated from the linear input-output intensity plot beyond threshold) is roughly 40%. This matches the prediction of Eq. (4) and is also consistent with the simple relationship of $q_{lase} = \Delta P_{out} f_p / \eta \Delta P_{src} f_1 \approx P_{cav}^{rad}/P_{loss}^{tot}$ presented above. Specifically, $P_{cav}^{rad}/P_{loss}^{tot} = 50\%$ for the passive cavity considered in TABLE 1 and further reduction to 40% arises when the absorption losses in the dye's triplet states are included.

FIG. 5A also illustrates the photobleaching lifetime of the dye system under continuous excitation. From FIG. 5A, $\tau_{system}^{bleach}$ decreases linearly with the excitation intensity below threshold and clamps at its threshold value upon lasing. To understand this behavior, consider the bleaching quantum efficiency in Eq. (6), which is $q_{bleach} = 5 \times 10^{-5}$. This implies that every molecule in the dye laser can be recycled to produce roughly $q_{lase}/q_{bleach} = 8 \times 10^3$ emitted photons before it is lost in $N_4$. When the pump rate is high, the molecules are recycled through the $S_0 S_1$ states at a faster rate; each molecule reaches its maximum emission of $8 \times 10^3$ photons in a shorter time period. Hence, the photobleaching rate increases linearly with the excitation intensity. However, once lasing is attained, the additional pumping power above threshold is channeled entirely into the coherently oscillating cavity mode and $\tau_{system}^{bleach}$ clamps at its threshold value $\tau_{lase}^{bleach}$ (see Eq. (5)). The bleaching quantum efficiency $q_{bleach}$ can be reduce by two orders of magnitude to $5 \times 10^{-7}$ if an appropriate triplet quencher for R6G is used to reduce $\tau_t/\tau_{isc}$ from 100 to 1.

The agreement between the analytic and numerical solutions are excellent in FIG. 5A except for $\tau_{lase}^{bleach}$ value which differs by a factor of about 1.5. This mismatch occurs because the analytic solutions considered the steady-state $N_4$ and $N_{tot}$ values (without photobleaching) even though they are in fact time-dependent quantities. Nonetheless, this discrepancy remains smaller than a factor of 2 in all the examples considered here.

FIG. 5B shows the temporal development of the lasing action in the same laser for three $\eta I_{src}$ values near the threshold. Below threshold at $\eta I_{src} = 0.5$ W/cm², the spontaneous emission corresponds to roughly one noise photon. When $\eta I_{src}$ is increased to 0.9 W/cm², the laser is turned on initially between $10^{-8}$ s to $10^{-5}$ s where the output intensity reaches more than three orders of magnitude above that of the noise photon. However, the laser shuts down at $10^{-5}$ s and the output decreases by two orders of magnitude to a quasi steady-state level before the dye photobleaches. The initial turn-on occurs when $I_{src}$ is high enough to overcome the total losses in the singlet states. As the triplet states begin to populate, the associated absorption losses and trapping of molecules eventually quench the singlets inversion. At higher pumping rate of $\eta I_{src} = 1.6$ W/cm², the laser is turned on and the stimulated emission of light is sustained even after the triplet excited state absorption kicks in. In all the three cases above, dye emission ceases after $10^{-1}$ s due to the molecular losses in $N_4$. Moreover, a series of very narrow spikes whose amplitudes die down with time can be observed upon turn on of the laser. These phenomena of spiking and relaxation oscillations are characteristics of laser systems in which the recovery time of the excited state population inversion is longer than the total decay time of the lasing mode.

In FIGS. 6A-6D and FIGS. 7A-7D, five parameters of the laser system are varied and their effects on the threshold ($\eta I_{src}^{thr}$) and corresponding photobleaching modification factor ($F_{lase}^{bleach}$) are studied, where $\eta$ is the fraction of the excitation power absorbed by the dye. These results are plotted using Eqs. (2) and (5), respectively. For illustrative purpose, the five parameters varied here are the total quality factor of the passive cavity ($Q_{tot}$), intersystem crossing lifetime ratio ($\tau_t/\tau_{isc}$), dye concentration, confinement factor ($\Gamma_s$), and the spontaneous emission enhancement factor ($F_p$). The parameter values used are listed in TABLE 1 for R6G in solution, except for the plot in FIGS. 6D and 7D, where $\tau_t$, is 10 µs so that $\tau_t/\tau_{isc}$=100 instead of 1. Practical values of $Q_{tot}$ range from few hundreds to tens of millions, and the threshold intensity decreases with increasing $Q_{tot}$. A reduced pumping intensity for lasing in turn lengthens the time it takes for the dye to photobleach. In the following analysis, the total quality factor $Q_{tot}$ is varied with each of the other four parameters above to understand the parameters' effects on the laser performances.

Intersystem Crossing Lifetime Ratio ($\tau_t/\tau_{isc}$)

Eqs. (2) through (5) show that the intersystem crossing lifetime ratio $\tau_t/\tau_{isc}$ affects lasing performance. Specifically, a high ratio increases the lasing threshold and decreases the slope efficiency and lasing lifetime $\tau_{lase}^{bleach}$. These observations can be understood from the accompanying build-up in the triplet state population, $N_4=\tau\tau_t/\tau_{isc}\times N_2$, through which high exciton and photon losses occur. Hence, in some embodiments, it is desirable that the organic gain media have small intersystem crossing lifetime ratios.

Figure 6A:
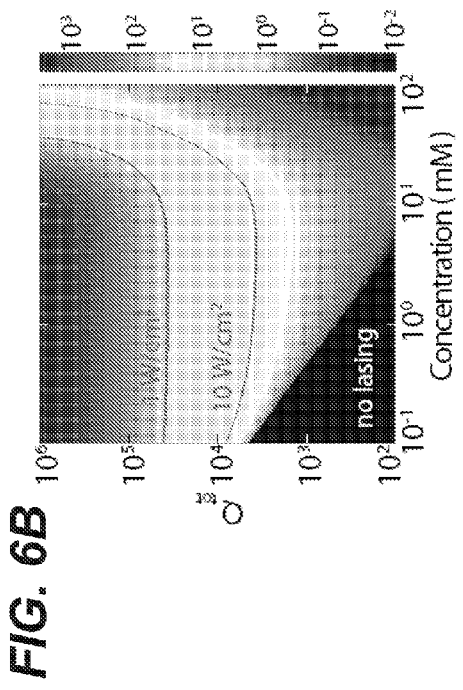
FIGS. 6A-6D are surface plots of the lasing threshold ($\eta I_{src}^{thr}$) of the organic active medium in FIG. 4 as a function of the cavity's total quality factor versus intersystem crossing lifetime ratio, dye concentration, confinement factor, and spontaneous emission enhancement factor, respectively.

In R6G, triplet quenchers which affect $\tau_t$ are readily available and by simultaneously changing the environment of the molecules from solid to solution, the intersystem crossing lifetime ratio can be varied over four orders of magnitudes, e.g., from 1 to $10^4$. FIG. 6A illustrates a cut-off beyond which lasing shut down as the intersystem crossing lifetime ratio increases. This happens when the triplets influence on the system is so high that its associated absorption and exciton annihilation process overwhelmed the stimulated emission of laser light. In other words, Eq. (3) cannot be satisfied. Note that high values of the lifetime ratio (e.g., above $10^3$) are typical in solid-state organic materials. On the other hand, as intersystem crossing lifetime ratio decreases, the triplet states become less populated and the threshold values saturated towards that of a short-pulse system where the energy transfers in the singlet states dominate.

Figure 7A:
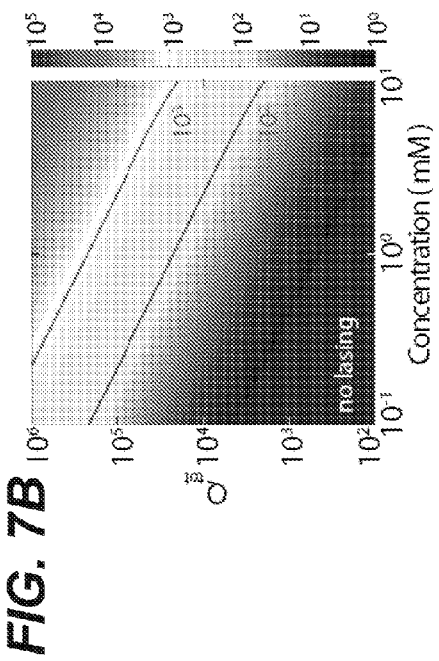
FIGS. 7A-7D are surface plots of the photobleaching modification factor ($F_{lase}^{bleach}$) of the organic active medium in FIG. 4 as a function of the cavity's total quality factor versus intersystem crossing lifetime ratio, dye concentration, confinement factor, and spontaneous emission enhancement factor, respectively.

Unlike the threshold values, the photobleaching factor in FIG. 7A does not saturate but continues to increase with declining intersystem crossing lifetime ratio. This trend is directly related to the reduced population of the $N_4$ state, where loss of the molecules takes place in this model, when the intersystem crossing lifetime ratio is small (e.g., about 0.5 to about 1.0). In this example, a threshold of $\eta I_{src}^{thr}$=0.7 W/cm$^2$ and photobleaching factor of $F_{lase}^{bleach}$=1125 is predicted for a continuous-wave R6G laser without moving dye media when $Q_{tot}$=5×10$^4$ and $\tau_t/\tau_{isc}$=1.

Dye Concentration

In diluted R6G with concentration below 5 mM, the quantum yield is high (e.g., $q_{dye}$=0.9) and the spontaneous emission lifetime $\tau_{spont}$ is approximately 5 ns. As the concentration increases beyond 10 mM, both the quantum yield of the dye and its spontaneous emission lifetime begin to decrease. This reduction in spontaneous emission lifetime originates from the close proximity among molecules in concentrated solutions which in turn lead to higher collision rates. In this example, the decay lifetimes in the molecules decrease at the same rate as the spontaneous emission lifetime at high concentration levels.

Figure 6B:
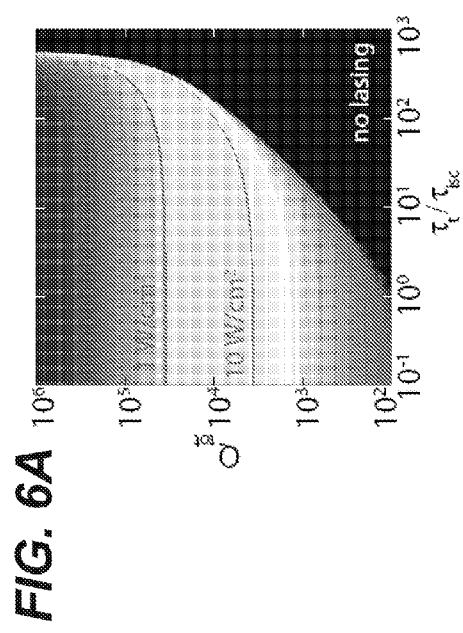
Figure 6C:
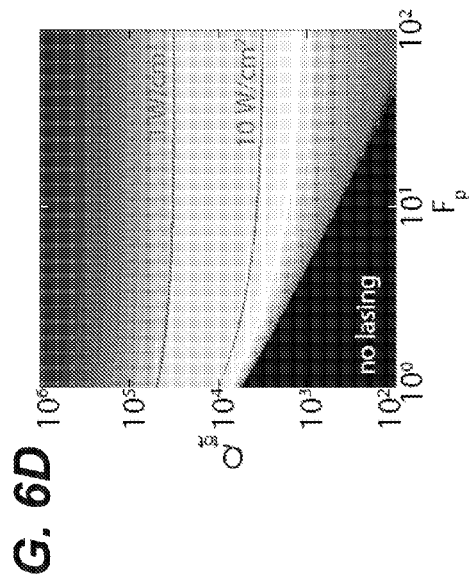

Without being bound by any particular theory, FIG. 6B suggests that, in some embodiments, a minimum dye concentration is required for lasing to take place (i.e., Eq. (3) is satisfied) when the cavity losses are high; dilute organic solutions cannot provide sufficient gain to overcome the total losses of the system. On the other hand, concentrated R6G solution above 10 mM is also undesirable because $q_{dye}$ begins to decrease causing the threshold to rise rapidly. Physically, a low $q_{dye}$ implies only a small fraction of the molecules excited into $N_2$ contributes to the emission of light. This leaves about 5-10 mM to be a suitable dye concentration for low-threshold laser operation.

Figure 7B:
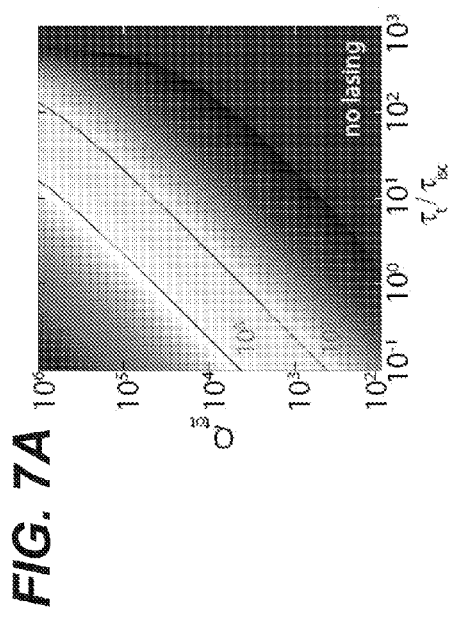

FIG. 7B shows that the photobleaching factor increases with concentration (up to 10 mM) for the plotted values of total quality factor $Q_{tot}$. This falls directly from the fact that a highly concentrated solution includes more molecules (assuming the same volume of dye) able to participate in the excitation and de-excitation processes, and be recycled through the $S_0 S_1$ states before they become quenched from photobleaching.

Lasing Mode Confinement Factor ($\Gamma_s$)

Figure 7C:
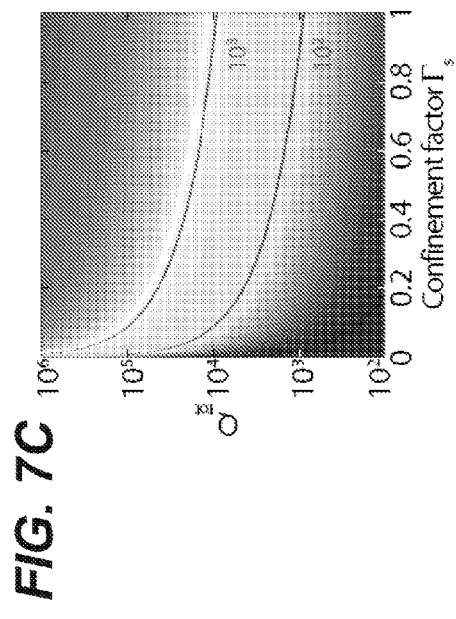
Figure 7D:
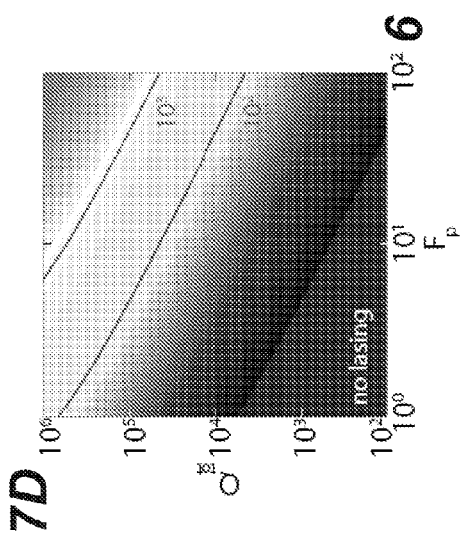

As understood by those of ordinary skill in the art, the lasing mode confinement factor (or simply the confinement factor) is the fraction of the total spatial modal energy (of the lasing mode) that overlaps the gain medium (in space). All other things being equal, a higher confinement factor leads to larger gain in the system for the same excitation level, and hence the threshold decreases with increasing confinement factor $\Gamma_s$. This reduction in the threshold excitation intensity in turn increases the photobleaching factor, as shown in FIG. 7C, and equivalently slows down the photobleaching rate. However, the decrease in the threshold and photobleaching rate is dampened by the enhanced self-absorption of the dye at higher confinement factor, and hence a gradual improvement of the laser performances with increasing confinement factor is observed. This applies when the confinement factor is greater than 0.1 for the range of total quality factors considered here.

Spontaneous Emission Enhancement Factor ($F_p$)

In this example, $\tau_t$ is assumed to be 10 µs so that $\tau_t/\tau_{isc}$=100 instead of 1 as considered in TABLE 1. $F_p$ is the enhancement to the spontaneous emission rate of the bulk organic dye ($1/\tau_{spont}$) in the presence of a cavity. It can be high in microcavities ($F_p$=75) with small mode volumes, while maintaining its influence over a reasonably large spectrum of the emitter's bandwidth (e.g., at a quality factor of about 80).

Figure 6D:
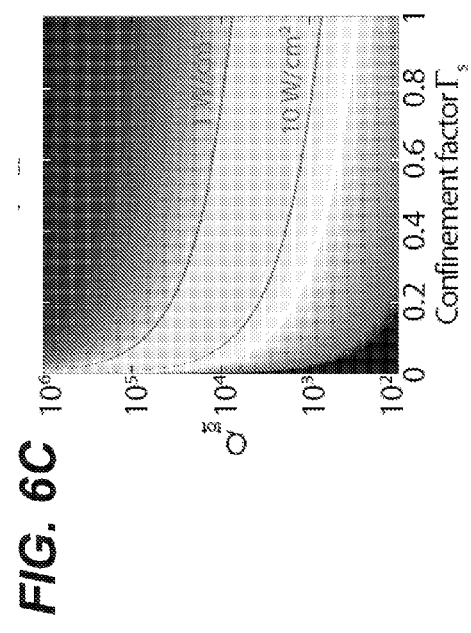

FIG. 6D shows that the spontaneous emission enhancement factor plays an important role in enabling lasing (especially at low total quality factors). However, its impact on threshold reduction diminishes as $F_p$ increases; the $F_p$ factors in the numerator and denominator of Eq. (2) cancel when the leading terms dominate at large values of $F_p$. A physical interpretation is that a high spontaneous emission enhancement factor leads to a desirable enhancement in the stimulated emission of light and an increase of the spontaneous emission rate. Since the spontaneously emitted light is characterized as noise in a laser, the latter process is undesirable once lasing has taken place. In particular, spontaneous emission becomes a competing radiative process to stimulated emission through which molecules can decay radiatively out of the $N_2$ metastable state. When the spontaneous emission enhancement factor becomes large, these two processes (stimulated and spontaneous emission) become equally dominant and the resulting reduction in threshold saturates. On the other hand, the photobleaching lifetime of the dye does not saturate but continues to lengthen as the spontaneous emission enhancement factor increases. This trend is directly related to the reduced population of the $N_4$ state when the total stimulated and spontaneous emission rates are enhanced. In the analysis above, the spontaneous emission coupling factor $\beta$ is kept unchanged to isolate the influence of the spontaneous emission enhancement factor. As the spontaneous emission enhancement factor value becomes large, the two quantities will become interdependent.

Rate Equations and Parameter Values of Organic Lasing Model

This section presents the set of the spatially-averaged coupled rate equations that are used to model an organic gain medium described by the processes shown in FIG. 4. This general energy-level model of an organic molecule includes the three lowest singlet and two lowest triplet states. The optical transition terms of this model are related to the experimentally-measured cross-sections $\sigma$, and show how such formalism can incorporate the cavity enhancement effects through the spontaneous emission enhancement factor $F_P$ and spontaneous emission coupling factor $\beta$.

The rate equations of the molecular populations in each level ($N_0$ to $N_9$), and the phenomenological rate equation describing the lasing photon number $\phi_s$ are $$\frac{dN_0}{dt} = -\frac{P_{src}}{hf_p}\eta^{S_0S_1}\frac{(N_0-N_3)}{N_{tot}} - \qquad (8)$$
$$v_g\sigma_{abs}^{S_0S_1}\Gamma_s\phi_s\frac{(N_0-N_2)}{V} + \frac{N_1}{\tau_{10}} + F_p\frac{(1-\beta_{cav}\Gamma_s)}{\tau_{spont}}N_2$$

$$\frac{dN_1}{dt} = +F_p\frac{\beta_{cav}}{\tau_{spont}}\Gamma_s\phi_s(N_2-N_1) + N_2\left(F_p\frac{\beta_{cav}\Gamma_s}{\tau_{spont}} + \frac{1}{\tau_{21}}\right) + \frac{N_4}{\tau_t} - \frac{N_1}{\tau_{10}} \qquad (9)$$

$$\frac{dN_2}{dt} = -F_p\frac{\beta_{cav}}{\tau_{spont}}\Gamma_s\phi_s(N_2-N_1) - \qquad (10)$$
$$v_g\sigma_{abs}^{S_1S_2}\Gamma_s\phi_s\frac{(N_2-N_8)}{V} - N_2\left(\frac{F_p}{\tau_{spont}} + \frac{1}{\tau_{21}} + \frac{1}{\tau_{isc}}\right) -$$
$$\frac{P_{src}}{hf_p}\eta^{S_1S_2}\frac{(N_2-N_9)}{N_{tot}} + v_g\sigma_{abs}^{S_0S_1}\Gamma_s\phi_s\frac{(N_0-N_2)}{V} + \frac{N_3}{\tau_{32}}$$

$$\frac{dN_3}{dt} = +\frac{P_{src}}{hf_p}\eta^{S_0S_1}\frac{(N_0-N_3)}{N_{tot}} + \frac{N_8}{\tau_{83}} - \frac{N_3}{\tau_{32}} \qquad (11)$$

$$\frac{dN_4}{dt} = -\frac{P_{src}}{hf_p}\eta^{T_1T_2}\frac{(N_4-N_7)}{N_{tot}} - \qquad (12)$$
$$v_g\sigma_{abs}^{T_1T_2}\Gamma_s\phi_s\frac{(N_4-N_6)}{V} + \frac{N_2}{\tau_{isc}} + \frac{N_5}{\tau_{54}} - \frac{N_4}{\tau_t} - \frac{N_4}{\tau_{bleach}}$$

$$\frac{dN_5}{dt} = +\frac{N_6}{\tau_{65}} - \frac{N_5}{\tau_{54}} \qquad (13)$$

$$\frac{dN_6}{dt} = +v_g\sigma_{abs}^{T_1T_2}\Gamma_s\phi_s\frac{(N_4-N_6)}{V} + \frac{N_7}{\tau_{76}} - \frac{N_6}{\tau_{65}} \qquad (14)$$

$$\frac{dN_7}{dt} = +\frac{P_{src}}{hf_p}\eta^{T_1T_2}\frac{(N_4-N_7)}{N_{tot}} - \frac{N_7}{\tau_{76}} \qquad (15)$$

$$\frac{dN_8}{dt} = +v_g\sigma_{abs}^{S_1S_2}\Gamma_s\phi_s\frac{(N_2-N_8)}{V} + \frac{N_9}{\tau_{98}} - \frac{N_8}{\tau_{83}} \qquad (16)$$

$$\frac{dN_9}{dt} = +\frac{P_{src}}{hf_p}\eta^{S_1S_2}\frac{(N_2-N_9)}{N_{tot}} - \frac{N_9}{\tau_{98}} \qquad (17)$$

$$\frac{d\phi_s}{dt} = \qquad (18)$$
$$-\frac{v_g\Gamma_s\phi_s}{V}\left[\sigma_{abs}^{S_0S_1}(N_0-N_2) + \sigma_{abs}^{S_1S_2}(N_2-N_8) + \sigma_{abs}^{T_1T_2}(N_4-N_6)\right] -$$
$$\frac{\phi_s}{\tau_{loss}} + F_p\frac{\beta_{cav}}{\tau_{spont}}\Gamma_s\phi_s(N_2-N_1) + F_p\frac{\beta_{cav}}{\tau_{spont}}\Gamma_sN_2.$$

It is implied in the above that $P_{src}$, $N_i$ (i=0 to 9), and $\phi_s$ are time-dependent quantities. $\Gamma_s$ and $v_g$ are the confinement factor and group velocity of the lasing mode in the organic region while $$N_{tot} = \sum_{i=0}^{9} N_i = N_{tot}^{den} \times V$$

is the total molecular population obtained by taking the product of the molecular density and volume of the organic medium. $\tau_{ij}$ is the non-radiative decay lifetime of the molecules from level i to j. $\tau_{loss}$ is the photon lifetime in the passive cavity and is related to the total quality factor of the cavity by $Q_{tot}=2\pi f_l\tau_{loss}$ ($f_l$ is the lasing frequency). It accounts for the photon losses due to radiation into the far-field (with photon decay lifetime $\tau_{cav}^{rad}$), scattering from surface roughness and material absorption in actual devices. The laser output is then computed as $P_{out}=hf_l\phi_s/\tau_{cav}^{rad}$.

In the excitation terms of the rate equations, $P_{src}$ is the source power, $f_p$ is the excitation frequency, and $\eta^{S_0S_1}$ is the fraction of the pump emission absorbed in the $S_0S_1$ states of the organic medium. These pump terms excite molecules from the $S_0$, $S_1$ and $T_1$ states to their respective higher energy levels separated by the photon energy $hf_p$. In a single-pass absorption of the pump light over a distance l, $\eta^{S_0S_1}$ is typically approximated by $\sigma_{pump}^{S_0S_1}\Gamma_p lN_{tot}^{den}$ where $\sigma_{pump}^{S_0S_1}$ is the experimentally measured absorption cross section of the bulk medium at the excitation wavelength and $\Gamma_p$ is the confinement factor of the pumping mode in the organic medium. However, in cases where the pump light is resonantly coupled into the organic medium and the absorption of light occurs over multiple passes, the relationship between $\eta$ and $\sigma_{pump}$ is less trivial. For instance, in a system comprising R6G placed on top of a photonic crystal slab cavity (e.g., as shown in FIG. 2), $\eta^{S_0S_1}$ is estimated by considering the system's total losses (both absorption in the dye as well as radiation and scattering losses of the cavity) and applying the Q-matching arguments.

Although the numerical simulations of the full model presented here account for pumping transitions in $S_0S_1$, $S_1S_2$ and $T_1T_2$, the excitation of the molecules from $S_0$ to $S_1$ is most significant because its absorption cross section is an order of magnitude larger than those in $S_1S_2$ and $T_1T_2$. Moreover, the population of the ground singlet state is also larger than those in $S_1$ and $T_1$, which further diminishes the importance of the pumping transitions in both $S_1S_2$ and $T_1T_2$ when operating at power levels near the lasing threshold. Thus, in deriving the analytic solutions above, only the pumping transition from $S_0$ to $S_1$ is considered. Apart from the pump-induced excitations of the molecules, the emitted lasing light is also re-absorbed by the dye to excite molecules from the $S_0$, $S_1$ and $T_1$ states to their respective higher energy levels separated by the photon energy $hf_l$. These self-absorption transitions are represented in the rate equations using the cross sections $\sigma_{abs}$.

The cavity enhancement effects can be introduced into the stimulated and spontaneous emission terms of the rate equations. This can be done by relating the experimentally measured stimulated emission cross sections $\sigma_{se}$ to the spontaneous emission coupling factor $\beta$. In bulk organic media, $\sigma_{se}=\lambda_l^4 g(\lambda_l)/8\pi c n_{eff}^2 \tau_{spont}$, and $\beta=\lambda_l^4 g(\lambda_l)/8\pi n_{eff}^3 V$ in bulk systems (e.g., large resonators). In both relationships, $g(\lambda_l)$ is the photoluminescence spectrum normalized to the fluorescence quantum yield $q_{dye}$, $n_{eff}$ is the effective index of the lasing mode, and c is the speed of light. $\tau_{spont}$ is the spontaneous emission lifetime in $N_2$ and is related to the non-radiative lifetime $\tau_{21}$ by $q_{dye}$, where $\tau_{spont}=\tau_{21}(1-q_{dye})/q_{dye}$. The energy separation between $N_2$ and $N_1$ is $hf_l$.

The expressions of $\sigma_{se}$ and $\beta$ for bulk systems can be manipulated to show that $c\sigma_{se}/n_{eff}V=\beta/\tau_{spont}$. This relationship is used to replace the typical stimulated emission terms involving $\sigma_{se}$ with $\beta\Gamma_s\phi_s(N_2-N_1)/\tau_{spont}$ in the rate equations. As in other optically induced transitions including the absorption of the pump and emitted light, the stimulated emission term is directly proportional to the field intensity (e.g., through $\phi_s$ or $P_{src}$) and the population difference between the two levels connecting these transitions. The cavity enhancement effects are then included in our model by replacing $\beta/\tau_{spont}$ above with the enhanced spontaneous emission rate defined in Eq. (1). Even though $F_p$ and $\beta$ appear as two independent quantities in Eq. (1), the value of $\beta$ depends on $F_p$ when its magnitude is high.

In the rate equations, $\tau_{isc}$ is the intersystem-crossing lifetime of the molecules from $S_1$ to $T_1$, while $\tau_t$ is the triplet decay lifetime (both radiative and non-radiative) of molecules from $T_1$ to $S_0$. Phosphorescence arising from the decay of triplet molecules in $T_1$ is usually overshadowed by fluorescence in $S_0S_1$ (i.e., $\tau_{spont}=\tau_t$) and is not considered here. The transitions of molecules between the singlet and triplet states are energetically allowed but spin-forbidden, and so they occur at a slower rate ($>10^{-7}$ s) than the singlet-singlet transitions ($<10^{-8}$ s). This allows the triplet influences in an organic laser system to be reduced by pumping with a pulse width shorter than $\tau_{isc}$, or by circulating the organic dye solution through the cavity at a rate faster than $1/\tau_{isc}$. A build-up of the triplet population may degrade the lasing performances by increasing the threshold and bleaching rate, while simultaneously decreasing the slope efficiency.

Photobleaching of the organic medium is modeled through the irreversible loss of molecules in the triplet state, which is typically regarded as unstable due to its high chemical reactivity in an oxygen environment. $\tau_{bleach}$ is the photobleaching lifetime in $N_4$. It can be markedly different depending if the medium is exposed to an oxygen-rich or oxygen-deficient surroundings, or when different solvents are used with the dyes. It is sometimes also modeled to occur in the excited singlet state $S_1$. This framework is based on the conventional approach of modeling the loss of molecules in $T_1$, but the framework can be extended to include the photobleaching process in $S_1$.

TABLE 1 provides the parameters used in the steady-state calculations above based on gain medium comprising R6G in solution (laser wavelength $\lambda_1=580$ nm, pump wavelength $\lambda_p=532$ nm):

TABLE 1

Parameters of organic laser system based on R6G solution assumed for steady-state calculations.

| | | |
|---|---|---|
| Dye concentration | — | 5 mM |
| Fluorescence quantum yield | $q_{dye}$ | 0.9 |
| Spontaneous emission lifetime | $\tau_{spont}$ | 5 ns |
| Intersystem crossing lifetime | $\tau_{isc}$ | 100 ns |
| Triplet to singlet relaxation lifetime (with triplet quencher) | $\tau_t$ | 100 ns |
| Triplet photo-bleaching lifetime | $\tau_{bleach}$ | 8 ms |
| Non-radiative relaxation lifetime from level i to j | $\tau_{ij}$ | 1 ps |
| Self-absorption cross-section in $S_0S_1$ | $\sigma_{abs}^{S_0S_1}(\lambda_l)$ | $10^{-19}$ cm$^2$ |
| Self-absorption cross-section in $S_1S_2$ | $\sigma_{abs}^{S_1S_2}(\lambda_l)$ | $10^{-17}$ cm$^2$ |
| Self-absorption cross-section in $T_1T_2$ | $\sigma_{abs}^{T_1T_2}(\lambda_l)$ | $10^{-17}$ cm$^2$ |
| Thickness of gain region | — | 30 nm |
| Confinement factor of lasing mode | $\Gamma_s$ | 0.2 |
| Spontaneous emission enhancement factor | $F_p$ | 1 |
| Spontaneous emission coupling factor | $\beta$ | $1 \times 10^{-4}$ |
| Total quality factor of passive cavity | $Q_{tot}$ | $5 \times 10^4$ |
| Quality factor of cavity due to radiation-loss | $Q_{cav}^{rad}$ | $1 \times 10^5$ |

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, the embodiments may be implemented using hardware, software or a combination thereof. When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

The various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above.

The terms "program" or "software" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of" "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. An organic dye laser comprising:
a resonant cavity;
an organic dye medium disposed with respect to the resonant cavity such that, during operation of the organic dye laser, the organic dye medium is electromagnetically coupled to the resonant cavity; and
an optical pump source disposed with respect to the resonant cavity and the organic dye medium such that, during operation of the organic dye laser, the optical pump source excites the organic dye medium with a continuous-wave pump beam that is stationary with respect to the organic dye medium on a macroscopic scale so as to stimulate emission of a continuous-wave beam, from the organic dye medium, that resonates within the resonant cavity.

2. The laser of claim 1, wherein the resonant cavity is characterized by a total quality factor $Q_{tot}$ of about $5 \times 10^3$ to about $5 \times 10^6$.

3. The laser of claim 1, wherein the resonant cavity is characterized by a spontaneous emission enhancement factor $F_p$ of about 1 to about 100.

4. The laser of claim 1, wherein the organic dye medium comprises a liquid.

5. The laser of claim 1, wherein the organic dye medium comprises a solid.

6. The laser of claim 1, wherein the organic dye medium has a dye concentration of about 0.1 mM to about 10 mM.

7. The laser of claim 1, wherein the organic dye medium is characterized by a lasing mode confinement factor $\Gamma_s > 0.1$.

8. The laser of claim 1, wherein the organic dye medium comprises:
at least one quenching molecule to quench at least one undesired transition caused by absorption of the continuous-wave pump beam by the organic dye medium.

9. The laser of claim 1, wherein the optical pump source comprises a tunable optical pump source.

10. The laser of claim 1, further comprising:
an actuator, coupled to the resonant cavity, to vary a length of the resonant cavity.

11. A method of generating a continuous-wave output beam from an organic dye medium electromagnetically coupled to a resonant cavity, the method comprising:

(A) generating a continuous-wave pump beam that is stationary with respect to the organic dye medium on a macroscopic scale; and
(B) pumping the organic dye medium with the continuous-wave pump beam so as to cause the organic dye medium to emit a continuous-wave output beam.

12. The method of claim 11, wherein (A) comprises:
tuning a wavelength of the continuous-wave pump beam so as to vary an amplitude of the continuous-wave output beam.

13. The method of claim 11, further comprising:
(C) disposing at least one quenching molecule in electromagnetic communication with the organic dye medium so as to quench at least one undesired transition caused by pumping the organic dye medium with the continuous-wave pump beam.

14. The method of claim 11, further comprising:
(D) varying a length of the resonant cavity so as to vary a wavelength of the continuous-wave output beam.

15. A laser comprising:
a resonant cavity characterized by a spontaneous emission coupling factor $\beta$ and a spontaneous emission enhancement factor $F_p$;
an organic gain medium characterized by a population $N_{tot}$ and a confinement factor $\Gamma_s$; and
a pump source to excite a transition of the organic gain medium characterized by a total emission lifetime $\tau_{spont}$, a triplet decay lifetime $\tau_t$, and an intersystem crossing lifetime $\tau_{isc}$ so as to produce at least one photon having a loss rate of $1/\tau'_{loss}$ due to both loss in the resonant cavity and absorption in the organic gain medium, wherein:

$$\frac{\beta F_p \Gamma_s N_{tot}}{\tau_{spont}} > \frac{(1 + \tau_t / \tau_{tsc})}{\tau''_{loss}}.$$

16. The laser of claim 15, wherein the spontaneous emission enhancement factor $F_p$ is greater than 1.

17. The laser of claim 15, wherein the organic gain medium comprises a solid.

18. The laser of claim 15, wherein the organic gain medium comprises a liquid.

19. The laser of claim 15, wherein the total emission lifetime $\tau_{spont}$ is about 0.1 ns to about 10 ns.

20. The laser of claim 15, wherein the triplet decay lifetime $\tau_t$ is about 100 ns to about 10 ms.

21. The laser of claim 15, wherein the intersystem crossing lifetime $\tau_{isc}$ is about 10 ns to about 1 ms.

22. The laser of claim 15, wherein the loss rate of $1/\tau'_{loss}$ is about $5 \times 10^8$ s$^{-1}$ to about $5 \times 10^{13}$ s$^{-1}$.

* * * * *